US008853723B2

(12) United States Patent
Simone et al.

(10) Patent No.: US 8,853,723 B2
(45) Date of Patent: Oct. 7, 2014

(54) LIGHT EMITTING DIODE ASSEMBLY AND THERMAL CONTROL BLANKET AND METHODS RELATING THERETO

(75) Inventors: Christopher Dennis Simone, Pickerington, OH (US); Thomas Edward Carney, Orient, OH (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 572 days.

(21) Appl. No.: 13/150,556

(22) Filed: Jun. 1, 2011

(65) Prior Publication Data

US 2012/0049220 A1 Mar. 1, 2012

Related U.S. Application Data

(60) Provisional application No. 61/374,905, filed on Aug. 18, 2010, provisional application No. 61/374,924, filed on Aug. 18, 2010, provisional application No. 61/374,936, filed on Aug. 18, 2010, provisional application No. 61/378,466, filed on Aug. 31, 2010.

(51) Int. Cl.
*H01L 33/48* (2010.01)
*H01L 33/60* (2010.01)

(52) U.S. Cl.
USPC 257/98; 257/100; 257/E33.056; 257/E33.072; 428/473.5

(58) Field of Classification Search
USPC ............ 257/79, 98, 99, 100; 428/473.5, 323, 428/328
See application file for complete search history.

(56) References Cited

U.S. PATENT DOCUMENTS

| | | |
|---|---|---|
| 4,851,505 A | 7/1989 | Hayes |
| 4,912,197 A | 3/1990 | Hayes |
| 5,071,997 A | 12/1991 | Harris |
| 5,145,999 A | 9/1992 | Auman et al. |
| 5,166,308 A | 11/1992 | Kreuz et al. |
| 5,177,176 A | 1/1993 | Auman |
| 5,215,824 A | 6/1993 | Munro, III et al. |
| 5,280,103 A | 1/1994 | Auman et al. |
| 5,286,841 A | 2/1994 | Auman et al. |
| 5,298,331 A | 3/1994 | Kanakarajan et al. |
| 5,302,652 A | 4/1994 | Parish |
| 5,322,917 A | 6/1994 | Auman et al. |
| 5,344,916 A | 9/1994 | Harris et al. |
| 5,428,102 A | 6/1995 | St. Clair et al. |
| 5,480,964 A | 1/1996 | Harris et al. |
| 5,520,845 A | 5/1996 | Auman et al. |
| 5,580,950 A | 12/1996 | Harris et al. |
| 5,614,607 A | 3/1997 | Hay et al. |
| 5,649,045 A | 7/1997 | Fjare et al. |
| 5,853,907 A | 12/1998 | Yamada et al. |
| 6,067,139 A | 5/2000 | Bohm et al. |
| 6,096,482 A | 8/2000 | Omote et al. |
| 6,139,926 A | 10/2000 | Auman et al. |
| 6,279,857 B1 | 8/2001 | Roth |
| 6,348,245 B1 | 2/2002 | Auman et al. |
| 6,492,031 B1 | 12/2002 | Moriyama et al. |
| 6,517,920 B1 | 2/2003 | Schroder et al. |
| 6,614,172 B2 | 9/2003 | Chiu et al. |
| 6,623,826 B2 | 9/2003 | Hasegawa et al. |
| 7,080,447 B2 | 7/2006 | Maa et al. |
| 7,208,206 B2 | 4/2007 | Hieda et al. |
| 7,270,891 B2 | 9/2007 | Roth et al. |
| 7,282,279 B2 | 10/2007 | Murayama et al. |
| 7,323,238 B2 | 1/2008 | Kondo et al. |
| 7,427,423 B2 | 9/2008 | Beroz et al. |
| 7,431,479 B2 | 10/2008 | Weaver, Jr. et al. |
| 7,550,194 B2 | 6/2009 | Simone et al. |
| 2004/0108504 A1 | 6/2004 | Forbes et al. |
| 2005/0131121 A1 | 6/2005 | Tsutsumi et al. |
| 2005/0221023 A1 | 10/2005 | Sakamoto et al. |
| 2006/0106193 A1 | 5/2006 | Moriyama et al. |
| 2006/0148962 A1 | 7/2006 | Bersted et al. |
| 2007/0232734 A1 | 10/2007 | Kanakarajan et al. |
| 2007/0292709 A1 | 12/2007 | Oishi et al. |
| 2008/0144322 A1 | 6/2008 | Norfidathul et al. |
| 2009/0092759 A1 | 4/2009 | Chen et al. |
| 2009/0209725 A1 | 8/2009 | Teshiba |
| 2009/0227050 A1 | 9/2009 | Shin et al. |
| 2012/0009406 A1* | 1/2012 | Auman et al. ................ 428/220 |

FOREIGN PATENT DOCUMENTS

| | | |
|---|---|---|
| CZ | A-44 03 933 | 8/1994 |
| EP | 0 274 121 A2 | 7/1988 |
| EP | 0 659 800 A1 | 6/1995 |
| EP | 1 749 850 Al | 2/2007 |
| EP | 1 813 424 A1 | 8/2007 |
| JP | 59-184257 | 10/1984 |
| JP | 63-243145 | 3/1987 |
| JP | 62-085941 A | 4/1987 |
| JP | 04047933 | 2/1992 |
| JP | 063 50210 A | 12/1994 |
| JP | 2000-143984 | 11/1998 |
| JP | 2000-226517 | 2/1999 |
| JP | 2006-18191 | 7/2004 |
| JP | 2008-168439 A | 7/2008 |
| JP | 2008-169237 A | 7/2008 |
| WO | WO 91/01340 | 2/1991 |
| WO | WO 02/097829 A1 | 12/2002 |
| WO | WO 2004/038760 A2 | 5/2004 |
| WO | WO 2009/012933 A1 | 1/2009 |
| WO | WO 2009/142940 A1 | 11/2009 |
| WO | 2010/036049 A2 | 4/2010 |

OTHER PUBLICATIONS

U.S. Appl. No. 61/374,844, filed Aug. 18, 2010, Simone.
U.S. Appl. No. 61/374,861, filed Aug. 18, 2010, Simone.
U.S. Appl. No. 61/378,462, filed Aug. 31, 2010, Simone.
U.S. Appl. No. 61/374,878, filed Aug. 18, 2010, Simone.
U.S. Appl. No. 61/374,905, filed Aug. 18, 2010, Simone.

(Continued)

*Primary Examiner* — Matthew W Such
*Assistant Examiner* — Scott Stowe

(57) ABSTRACT

The present disclosure relates generally to a light emitting diode assembly and a thermal control blanket. The light emitting diode assembly and the thermal control blanket have advantageous reflective and thermal properties.

12 Claims, No Drawings

(56) References Cited

OTHER PUBLICATIONS

U.S. Appl. No. 61/374,924, filed Aug. 18, 2010, Simone.
U.S. Appl. No. 61/374,936, filed Aug. 18, 2010, Simone.
U.S. Appl. No. 61/378,466, filed Aug. 31, 2010, Simone.
Abstract, DE-A-44 03 933, Central Glass Co., Ltd. "Claims 1-8".
Abstract, JP 04047933, Nippon Telegraph & Telephone Corp.
Abstract, JP 06350210, Asahi Kasei Kogyo KK.
Abstract, JP 59-184257, Nitto Electric Ind Co.
Abstract, JP 62085941, Nikkan Kogyo KK.
Abstract, JP 63-243145, Asahi Chem Ind Co Ltd.
Abstract, JP 2000-143984, Nippon Telegraph & Telephone Corp.
Abstract, JP 2000-226517, Unitika LTDCYC 1.
Abstract, JP 2006-018191, Sumitomo Bakelite Co. Ltd.
Abstract, JP 2008-168439, Toyobo KK.
Abstract, JP 2008-169237, Toyobo KK.
Research Disclosure 405061.
Swiatoslaw Trofiemenko and Brian C. Auman, Polyimides Based on 9,9-Disubstituted Xanthene Dianhydrides, Macromolecues 1994, vol. 27, pp. 1136-1146.
Extended European Search Report, EP 06 25 4059.
European Search Report, EP 94 11 8187.
Waters, et al., "Changes in Optical and Thermal Properties of the MISSE 2 PEACE Polymers and Spacecraft Silicones", $11^{th}$ International Symposium on Materials in Space Environment, Sep. 15-18, 2009, Aix en Provence, France.
PCT Search Report (PCT/US2011/038657).

* cited by examiner

LIGHT EMITTING DIODE ASSEMBLY AND THERMAL CONTROL BLANKET AND METHODS RELATING THERETO

FIELD OF DISCLOSURE

The field of disclosure is reflective materials for light emitting diode assemblies and thermal control blankets.

BACKGROUND OF THE DISCLOSURE

Broadly speaking, reflective materials for lighting systems are known; see for example, published U.S. Patent Application, 2009-0227050 to Shin, et al. Such reflective materials are generally used to enhance and redirect light into a desired direction. Conventional reflective surfaces include metal coatings, white pigmented polyethylene terephthalate, and white pigmented polyamides. Conventional reflective surfaces can be problematic for any one of a number of reasons, such as:
i. insufficient whiteness, ii. insufficient reflectance, iii. poor reflectance and poor color stability upon thermal exposure over time (i.e. poor thermal aging), iv. poor mechanical properties, v. poor color stability upon UV exposure (i.e. poor UV aging), and vi. deformation or discoloration during soldering. A need therefore exists for improved reflective materials for lighting system assemblies.

SUMMARY

One embodiment of the present disclosure is a light emitting diode assembly. A light emitting diode assembly comprising:
A. a filled polyimide layer having a filled polyimide layer first surface and a filled polyimide layer second surface. The filled polyimide layer consisting essentially of:
  i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
  ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions;
B. electrically conductive circuit traces formed on at least the filled polyimide layer first surface;
C. at least one light emitting diode attached to the filled polyimide layer first surface or attached to the electrically conductive traces; and
D. an encapsulant covering exposed surfaces of the light emitting diode and at least a portion of the filled polyimide layer first surface.

Another embodiment of the present disclosure is a thermal control blanket comprising a filled polyimide layer. The filled polyimide layer consisting essentially of:
A. a polyimide in an amount from 50 to 75 weight percent of the filled polyimide layer, the polyimide being derived from:
  a) at least 45 mole percent of 3,3',4,4'-biphenyltetracarboxylic dianhydride, based on a total dianhydride content of the polyimide,
  b) at least 50 mole percent of 2,2'-bis(trifluoromethyl)benzidine based on a total diamine content of the polyimide; and
B. a white pigment in an amount from 20 to 50 weight percent of the filled polyimide layer and wherein the white pigment
  a) is less than 800 nanometers in at least one dimension,
  b) has an average aspect ratio greater than 3:1,
  c) is less than the filled polyimide layer thickness in all dimensions;
C. an electrically conductive filler in an amount up to 5 weight percent of the filled polyimide layer. The thermal control blanket has a L-color of at least 85 determined by ASTM E308 [10° observer and illuminant D65] and a reflectivity of at least 80 percent measured according to ASTM E1164.

DETAILED DESCRIPTION

Definitions

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only to those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The term "dianhydride" as used herein is intended to include precursors, derivatives or analogs thereof, which may not technically be a dianhydride but would nevertheless react with a diamine to form a polyamic acid which could in turn be converted into a polyimide.

The term "diamine" as used herein is intended to include precursors, derivatives or analogs thereof, which may not technically be a diamine but would nevertheless react with a dianhydride to form a polyamic acid which could in turn be converted into a polyimide.

The term "polyamic acid" as used herein is intended to include any polyimide precursor material derived from a combination of dianhydride and diamine and capable of conversion to a polyimide.

The term "chemical conversion" or "chemically converted" as used herein denotes the use of a catalyst, dehydrating agent or both to convert the polyamic acid to polyimide and is intended to include a partially chemically converted polyimide which is then dried at elevated temperatures to greater than 98 percent solids level.

The term "conversion chemicals" as used herein denotes a catalyst, dehydrating agent or both to convert the polyamic acid to polyimide.

The term "finishing solution" as used herein denotes a dianyhdride in a polar aprotic solvent which is added to a low molecular weight polyamic acid solution with amine chain ends to increase the molecular weight and viscosity of the polyamic acid solution. The dianhydride used is typically, but not necessarily, the same dianhydride used (or one of the same dianhydrides when more than one is used) to make the polyamic acid.

The term "panel" as used herein denotes a filled polyimide layer that has been cut to a desired size.

The term "prepolymer" as used herein is intended to mean a relatively low molecular weight polyamic acid solution at a concentration range between 15-25% by weight which is prepared by using a stoichiometric excess of diamine in order to give a solution viscosity of approximately 50-100 Poise.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range.

In describing certain polymers it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers, unless the context indicates or implies otherwise.

The materials, methods, and examples herein are illustrative only and, except as specifically stated, are not intended to be limiting. Although methods and materials similar or equivalent to those described herein can be used in the practice or testing of the present invention, suitable methods and materials are described herein.

In some embodiments, the present disclosure is directed to a light emitting diode assembly and a thermal control blanket, both having a filled polyimide layer. The filled polyimide layer contains a low color polyimide. Typically polyimides have some color ranging from yellow to orange/brown. The advantage of the polyimide of this disclosure is that when a white pigment of the present disclosure is added to the polyimide the resulting film is more true to the color of the pigment. Thus the filled polyimide films of the present disclosure are useful as reflective surfaces having high temperature exposure. The filled polyimide layer i. exhibits sufficient whiteness, ii. exhibits sufficient reflectance, iii. maintains reflectance and maintains color upon thermal exposure over time (i.e. good thermal aging), iv. has sufficient mechanical properties, and v. does not deform or discolor during soldering.

Polyimide

The polyimides of the present disclosure have an advantage over other polymers. The polyimide is an aromatic polyimide having high temperature stability and can withstand processing temperatures that are generally too high for many other polymers. The polyimides of the present disclosure have an advantage over other aromatic polyimides. The polyimides of the present disclosure exhibit low color and are transparent. The color, after the addition of pigment, is more true to the color of the pigment. For the purpose of this disclosure, low color is intended to mean greater than 80 percent light transmitted at wavelengths from 400 to 700 nm measured using a Agilent 8453 UV/Vis Spectrophotometer.

The polyimide is present in an amount between and including any two of the following: 50, 55, 60, 65, 70 and 75 weight percent of the filled polyimide layer. In some embodiments the polyimide is present in an amount from 50 to 75 weight percent of the filled polyimide layer.

The polyimides of the present disclosure have at least 45 mole percent of 3,3',4,4'-biphenyltetracarboxylic dianhydride (BPDA), based on a total dianhydride content of the polyimide, and at least 50 mole percent of 2,2'-bis(trifluoromethyl)benzidine (TFMB) based on a total diamine content of the polyimide. In some embodiments, the polyimide is derived from at least 50 mole percent of 3,3',4,4'-biphenyltetracarboxylic dianhydride, based on a total dianhydride content of the polyimide. In some embodiments, the polyimides of the present disclosure have at least 50 mole percent of 3,3',4,4'-biphenyltetracarboxylic dianhydride (BPDA), based on a total dianhydride content of the polyimide, and at least 50 mole percent of 2,2'-bis(trifluoromethyl)benzidine (TFMB) based on a total diamine content of the polyimide.

In some embodiments, BPDA monomer may be used alone (i.e., 100 mole percent of the total dianhydride component) or can be used in combination with one or more other dianhydrides of a select group disclosed herein. In some embodiments, the additional dianhydrides, used alone or in combination with one another, can make up no more than 55 mole percent of the total dianhydride content. In some embodiments, the additional dianhydrides can make up no more than 50 mole percent of the total dianhydride content.

In some embodiments, the polyimide is additionally derived from not more than 55 weight percent of pyromellitic dianhydride based on the total dianhydride content of the polyimide. In another embodiment, the polyimide is additionally derived from not more than 55 weight percent of 4,4'-oxydiphthalic anhydride (ODPA); 4,4'-(4,4'-isopropylidenediphenoxy)bis(phthalic anhydride) (BPADA); 2,3,3',4'-biphenyl tetracarboxylic dianhydride; 2,2',3,3'-biphenyl tetracarboxylic dianhydride or mixtures thereof based on the total dianhydride content of the polyimide. In another embodiment, the polyimide is additionally derived from not more than 55 weight percent of 4,4'-(hexafluoroisopropylidene) diphthalic anhydride (6FDA); based on the total dianhydride content of the polyimide. In yet another embodiment, the polyimide is additionally derived from not more than 55 weight percent of diphenylsulfonetetracarboxylic dianhydride (DSDA); 4,4'-bisphenol A dianhydride; 1,2,3,4-cyclobutanetetracarboxylic acid dianhydride; (−)-[1S*,5R*,6S*]-3-oxabicyclo[3.2.1]octane-2,4-dione-6-spiro-3-(tetrahydrofuran-2,5-dione); bicyclo[2.2.2]oct-7-ene-2,3,5,6-tetracarboxylicdianhydride; 9,9-disubstituted xanthenes or mixtures thereof based on the total dianhydride content of the polyimide.

In some embodiments, TFMB diamine monomer may be used alone (i.e., at a 100 percent mole ratio of the total diamine content) or in combination with one or more other diamines of a select group disclosed herein. These additional diamines, used alone or in combination with one another, can make up no more than 50 mole percent of the total diamine content. In some embodiments, the polyimide is additionally derived from not more than 50 mole percent of trans-1,4-diaminocyclohexane 3,5-diaminobenzotrifluoride; 2-(trifluoromethyl)-1,4-phenylenediamine; 1,3-diamino-2,4,5,6-tetrafluorobenzene; 2,2-bis(3-aminophenyl) 1,1,1,3,3,3-hexafluoropropane; 2,2'-bis-(4-aminophenyl)-hexafluoropropane (6F diamine); 3,4'-oxydianiline (3,4'-ODA), m-phenylene diamine (MPD), 4,4-bis(trifluoromethoxy)benzidine, 3,3'-diamino-5,5'-trifluoromethyl biphenyl, 3,3'-diamino-6,6'-trifluoromethyl biphenyl, 3,3'-bis(trifluoromethyl)benzidine; 2,2-Bis[4-(4-aminophenoxy) phenyl]hexafluoropropane (4-BDAF), 4,4'-diaminodiphenyl sulfide (4,4'-DDS); 3,3'-diaminodiphenyl sulfone (3,3'-DDS); 4,4'-diaminodiphenyl sulfone; 2,2'-bis(dimethyl)benzidine; 3,3'-bis(dimethyl)benzidine; 4,4'-trifluoromethyl-2,2'-diaminobiphenyl or mixtures thereof based on the total diamine content of the polyimide.

In some embodiments, the polyimide is additionally derived from not more than 50 mole percent of; diaminocyclooctane; tetramethylenediamine; hexamethylenediamine; octamethylenediamine; dodecamethylene-diamine; aminomethylcyclooctylmethanamine; aminomethylcyclododecylmethanamine; aminomethylcyclohexylmethanamine or mixtures thereof.

In some embodiments, the polyimide is derived from 90 mole percent of 3,3',4,4'-biphenyltetracarboxylic dianhydride (BPDA) and 100 mole percent of 2,2'-bis(trifluoromethyl)benzidine (TFMB). In some embodiments, a PMDA solution (finishing solution) is used to finish the BPDA//TFMB polyimide. In some embodiments, the polyimide is derived from 100 mole percent of 3,3',4,4'-biphenyltetracarboxylic dianhydride (BPDA) and 100 mole percent of 2,2'-bis(trifluoromethyl)benzidine (TFMB). In some embodiments, a BPDA solution (finishing solution) is used to finish the BPDA//TFMB polyimide.

The polyimide, being aromatic, has mechanical properties typically superior to films made with semi-aromatic polymers. Semi-aromatic polymers for the purpose of this disclosure is intended to mean condensation polymers where in 100 mole percent of only one of the monomer units is aliphatic. For example, either 100 mole percent of diol or 100 mole percent of dicarboxylic acid (ester) for forming a polyester is aliphatic (such as polyethylene terephthalate (PET)); or either 100 mole percent of dicarboxylic acid or 100 mole percent of diamine for forming a polyamide is aliphatic. Aromatic polymers are polymers where at least 50 percent of each monomer unit is aromatic. For example, at least 50 mole percent of diol and 50 mole percent of dicarboxylic acid (ester) for forming a polyester are aromatic. In some embodiments, advantages of aromatic polymers over semi aromatic polymers are aromatic polymers tend to have high Tg, high thermal stability and in many cases improved mechanical properties such as modulus, tensile strength and elongation. Improved mechanical properties can lead to advantages in handling and use. A higher modulus and higher elongation enable a film to be used in dynamic flexural applications. Aromatic polymers typically can withstand higher temperatures without degradation. Thus, aromatic polymers would be more advantageous than semi-aromatic polymers for the purposes of the present disclosure where the filled polyimide layer is exposed to elevated temperature over long periods of time. The exposure to elevated temperatures may be continuous or cumulative (a few hours at a time and over several uses). Elevated temperature is intended to mean temperatures higher than ambient. The polyimides of the present disclosure generally have a Tg from 320° C. to 350° C. The polyimides of the present disclosure generally have a coefficient of thermal expansion (CTE) from −5 to 10 ppm/° C. measured by TMA from 50-250° C.

In some embodiments, the dianhydrides (or diamines) used to form the polyimides disclosed herein can optionally comprise a reactive end group(s). Some of these reactive end groups can be nadic, acetylene, n-propargyl, cyclohexene, maleic, n-styrenyl, phenylethynyl. These reactive end groups can be used to end cap the polymer to either form a lower molecular weight polymer or to assist in crosslinking the polymer. Crosslinking of the polymer can increase the Tg and mechanical modulus of the polymer.

White Pigment

The filled polyimide layer contains a white pigment. The amount of white pigment needed to achieve high reflectivity is less than if a polyimide of the present disclosure were not used. The white pigment is present in an amount between and optionally including any two of the following numbers: 20, 25, 30, 35, 40, 45 and 50 weight percent of the filled polyimide film. In some embodiments, the white pigment is present in an amount from 20 to 50 weight percent of the filled polyimide film. In some embodiments, the white pigment is selected from the group consisting of zirconium oxide, calcium oxide, silicon oxide, zinc oxide, aluminum oxide, zinc sulfide, calcium sulfate, barium sulfate, lead carbonate, lead hydroxide, basic zinc molybdate, basic calcium zinc molybdate, lead white, molybdenum white, and lithopone. In another embodiment, the white pigment is titanium dioxide ($TiO_2$). In some embodiments, the white pigment may have a coating that wholly or partly covers the surface of the pigment as long as the coating does not negatively impact the reflectivity, whiteness or any other desirable property of the present disclosure including reflectivity and color stability upon thermal aging.

In some embodiments, white pigment may be surface treated with coupling agents or dispersing agents as long as the surface treatment does not negatively impact the advantages of the light emitting diode assembly.

The use of white pigment having a narrow size distribution tend to result in a smooth (glossy) surface and higher reflectance. It is generally known that matte surfaces tend to have irregular surfaces diffusely scattering light in all directions. A smooth surface (with less protrusions on the surface) tend to be glossy or reflective. In some embodiments, the white pigment:
  a. is less than 800 nanometers in at least one dimension,
  b. has an average aspect ratio greater than 3:1,
  c. is less than the filled polyimide layer thickness in all dimensions.

In some embodiments, the white pigment, or slurry thereof, may be milled to obtain desired particle size and break up any large particle agglomerates which may be present.

Filled Polyimide Layer

Filled polyimide layer of the present disclosure can be made by any well known method in the art for making filled polyimide films. In some embodiments, the polyimide is made by a chemical conversion process. In one embodiment, one such method includes preparing a white pigment slurry. The slurry may or may not be milled using a ball mill or continuous media mill to reach the desired particle size. The slurry may or may not be filtered to remove any residual large particles. A polyamic acid prepolymer solution is prepared by reacting dianhydride with a slight excess of diamine. The polyamic acid solution is mixed in a high shear mixer with the white pigment slurry. The amount of the polyamic acid solution, white pigment slurry, and finishing solution can be adjusted to achieve the desired loading levels of white pigment and the desired viscosity for film formation. The mixture can be metered through a slot die and cast or manually cast onto a smooth stainless steel belt or substrate to produce a gel film. Conversion chemicals can be metered in before casting using a slot die. For conversion to greater than 98 percent solids level, the gel film typically must be dried at elevated temperature (convective heating from 200-300° C. and radiant heating from 400-800° C.), which will tend to drive the imidization to completion.

Less white pigment is needed to achieve the desired whiteness and reflectance. Thus, the filed polyimide layer maintains good mechanical properties. In some embodiments, the filled polyimide layer has a modulus of at least 500 kpsi (35162 kg/cm$^2$). In some embodiments, the filled polyimide layer has a modulus of at least 900 kpsi (63291 kg/cm$^2$). Tensile Modulus was determined by ASTM D-882.

In some embodiments, the filled polyimide layer has elongation of at least 50 percent determined by ASTM D-882. An elongation of at least 50 percent is sufficient for flex circuit applications.

The thickness of the filled polyimide layer will depend on the application. Due to the transparency of polyimides of the present disclosure, some applications may require a thicker layer. In some embodiments, the thickness of the filled polyimide layer is from 25 to 130 microns.

Another advantage is the filled polyimide layer is capable of withstanding the harsh soldering step (solder reflow or solder coating) in which the electrically conductive circuit traces are formed. White polyethylene terphthalate (PET) typically has comparable reflectivity to the filled polyimide layer of the present disclosure. Generally, white PET deforms under solder conditions during the imaging process and therefore electrically conducting circuit traces could not be formed on a PET film. The filled polyimide layer of the present disclosure generally has a Tg from 320° C. to 340° C. The filled polyimide layer of the present disclosure generally has a CTE from 15 to 25 ppm/° C. measured by TMA from 50-250° C. The filled polyimide has a filled polyimide layer first surface and a filled polyimide layer second surface. The electrically conductive circuit traces are formed on the filled polyimide layer first surface with out a significant decrease in reflectivity or change in color. In some embodiments, the electrically conductive circuit traces are formed on the filled polyimide layer first surface and the filled polyimide layer second surface with out a significant decrease in reflectivity or change in color. The electrically conductive circuit traces provide an electrical connection for one or more than one light emitting diode.

In some embodiments, the filled polyimide layer additionally comprises an adhesive layer. The adhesive layer would be adjacent to the filled polyimide layer second surface. In some embodiments, the adhesive layer is an epoxy resin. In one embodiment, the adhesive consists of an epoxy resin and hardener, and, optionally, further contains additional components, depending on desired properties, such as, an elastomer reinforcing agent, curing accelerator, filler and flame retardant. In some embodiments, the epoxy resin is selected from the group consisting of bisphenol A type epoxy resin, bisphenol F type epoxy resin, bisphenol S type epoxy resin, phenol novolac type epoxy resin, cresol novolac type epoxy resin, biphenyl type epoxy resin, biphenyl aralkyl type epoxy resin, aralkyl type epoxy resin, dicyclopetadiene type epoxy resin, multifunctional type epoxy resin, naphthalene type epoxy resin, phosphorus containing epoxy resin, rubber modified epoxy resin and mixtures thereof.

In another embodiment, the adhesive layer is an acrylic adhesive or methacrylic adhesives ("acrylic" and/or "methacrylic" will be referred to herein as "(meth)acrylic"). In some embodiments, the adhesive layer is a pressure sensitive (meth)acrylic adhesive. (Meth)acrylic pressure sensitive adhesives are generally prepared by copolymerizing a suitable (meth)acrylic acid with alkyl esters and can include suitable tackfiers, plasticizers and other additives to adjust properties, as desired. Pressure sensitive (meth)acrylic adhesives are well known and need not be described in great detail here.

In some embodiments, filled polyimide layer is a multi-layer film having a first layer and a second layer. The first layer consisting essentially of:

A. a polyimide in an amount from 60 to 75 weight percent of the first layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;

B. a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the first layer thickness in all dimensions.

As the amount of filler increases, the more brittle a film tends to become, making the film more difficult to handle during the manufacturing process. Thus, the second layer comprises an unfilled polyimide that is the same or different from the polyimide in the first layer. The second layer allows the filled polyimide layer to maintain acceptable mechanical and electrical properties. In some embodiments, the second layer contains filler. The amount of filler in the second layer should not be greater than 20 weight percent based on the total weight of the second layer. The first layer can be bonded directly to the second layer, by lamination, coating or coextrusion. The first layer can be bonded indirectly by means of an adhesive to the second layer. The electrically conductive circuit traces are formed on the first layer without a significant decrease in reflectivity or change in color. When the filled polyimide layer is used in a light emitting diode assembly, a single light emitting diode (LED) or multiple LEDs may be attached to the electrically conductive circuit traces of the first layer by soldering. In another embodiment, a LED(s) is attached to a portion of the first layer that does not have the electrically conductive circuit traces.

Light Emitting Diode Assembly

One embodiment of the present disclosure is a light emitting diode assembly comprising:

A. filled polyimide layer of the present disclosure having a filled polyimide layer first surface and a filled polyimide layer second surface.

B. electrically conductive circuit traces formed on at least the filled polyimide layer first surface;

C. at least one light emitting diode attached to the filled polyimide layer first surface or attached to the electrically conductive traces; and D. an encapsulant covering exposed surfaces of the light emitting diode and at least a portion of the filled polyimide layer first surface.

The light emitting diode assembly of the present disclosure may be made by methods well know in the art. In some embodiments, the light emitting diode assembly is obtained by:

a) applying photoresist to the filled polyimide film areas to be imaged,
b) exposing and developing pattern in photoresist,
c) etching to remove unprotected metal,
d) stripping the resist protective material,
e) applying a solder mask to protect areas during subsequent steps.
f) applying solder (solder reflow or solder coating),
g) removing at least a portion of the solder (excess solder)

The excess solder is the solder that has not formed a chemical bond with the electrically conductive metal, typically copper. In some embodiments, the excess solder is removed by hot oil or hot air, often referred to as solder leveling.

h) attaching one or more LEDs. In some embodiments, a LED(s) is attached directly to the electrically conductive circuit trace by soldering. In another embodiment, a LED(s) is attached to a portion of the filled polyimide first surface that does not have the electrically conductive circuit traces by using, but not limited to, an adhesive or mechanical means and electrical connections can be formed using two wire leads. In some embodiments, an adhesive in addition to solder may be used to adhere the LED.

i) applying an encapsulant to cover exposed surfaces of the light emitting diode. The encapsulant may also cover a portion of or the entire filled polyimide layer first surface. In some embodiments, the encapsulant is a silicone or epoxy resin. The encapsulant provides environmental and mechanical protection. The encapsulant may further include a phosphor for wavelength conversion or a combination of phosphors. In some embodiments, the encapsulant also acts as a lens. In another embodiment, light emitting diode assembly comprises a light-scattering lens arranged over the encapsulant.

In some embodiments, a epoxy housing is also added during the patterning to contain the LED. After the wire bond is formed, encapsulant is then added to fill the epoxy housing.

An advantage of the light emitting diode assembly of the present disclosure is that the filled polyimide layer has:

i) an L-color of at least 85. In some embodiments, the light emitting diode circuit board substrate has an L-color of at least 90. The L-color as defined by CIE 1976 ($L^*$, $a^*$, $b^*$) color space determined by ASTM E308 [10° observer and illuminant D65]. An L-color of 100 is considered to be true white.

ii) a reflectivity of at least 80 percent. For LEDs, the more light reflected, the brighter, more efficient the LED. In some embodiments, the filled polyimide layer has reflectivity of at least 85 percent. The reflectivity is measured according to ASTM E1164. Thus, the light emitting diode assembly does not require additional reflective surfaces, such as a PET reflective tape or metal coating to enhance and direct light from the LED(s). Without the need for an additional reflective surface, the light emitting diode assembly of the present disclosure has a simplified structure, production and can provide a reduction in weight.

Yet another advantage of the light emitting diode assembly is the filled polyimide layer reflectivity and color are maintained during thermal aging either from heat cycling of the LED modules ranging from ambient temperature to 70° C. or typical operating environments in use.

In some embodiments, for the light emitting diode assembly, the polyimide is derived from 90 mole percent of 3,3',4,4'-biphenyltetracarboxylic dianhydride, and 100 mole percent of 2,2'-bis(trifluoromethyl)benzidine and the white pigment is titanium dioxide. In another embodiment, for the light emitting diode assembly, the polyimide is derived from 100 mole percent of 3,3',4,4'-biphenyltetracarboxylic dianhydride, and 100 mole percent of 2,2'-bis(trifluoromethyl) benzidine and the white pigment is titanium dioxide.

The filled polyimide layer of the light emitting diode assembly may optionally include reinforcing fillers, additives and the like so long as they do not negatively impact the advantages of the light emitting diode assembly. In some embodiments, examples of additives that would negatively impact the advantages of the light emitting diode assembly of the present disclosure are, but not limited to, black pigments or matting agents. In some embodiments, small amounts of blue pigment may be added. In small amounts, blue pigment visually enhances and/or balances the white color. Small amounts of blue pigment is intended to mean equal to or less than 1 weight percent. In some embodiments, blue pigments such as cobalt pigments, copper pigments, iron pigments, aluminum pigments or mixtures thereof may be used. In one embodiment, aluminum pigments are used. In some embodiments, the filled polyimide layer additionally consisting essentially of sodium aluminum sulfosilicate pigment (Ultramarine) in an amount between and optionally including any two of the following: 0.01, 0.05, 0.1, 0.2, 0.3, 0.4, 0.5, 0.6, 0.7, 0.8, 0.9 and 1 weight percent of the filled polyimide layer. In some embodiments, the filled polyimide layer additionally consisting essentially of sodium aluminum sulfosilicate pigment (Ultramarine) in an amount from 0.01 to 1 weight percent of the filled polyimide layer.

In some embodiments, the light emitting diode assembly additionally comprises a solder mask. The solder mask consists essentially of:

i). a polyimide in an amount from 50 to 75 weight percent of the solder mask, the polyimide being derived from:
 a. at least 45 mole percent of 3,3',4,4'-biphenyltetracarboxylic dianhydride, based on a total dianhydride content of the polyimide, and
 b. at least 50 mole percent of 2,2'-bis(trifluoromethyl)benzidine based on a total diamine content of the polyimide;

ii). a white pigment in an amount from 20 to 50 weight percent of the solder mask and wherein the white pigment
 a. is less than 800 nanometers in at least one dimension,
 b. has an average aspect ratio greater than 3:1,
 c. is less than the solder mask thickness in all dimensions.

In some embodiments, the thickness of the solder mask is between and optionally including any two of the following: 12, 15, 20, 30, 40, 50, 60, 70, 80, 90, 100, 110, 120 and 130 microns. In some embodiments, the thickness of the solder mask is from 12 to 130 microns. In another embodiment, the thickness of the solder mask is from 12 to 60 microns.

Broadly speaking, reflective solder masks are known; see for example, U.S. Pat. No. 7,431,479 to Weaver, et al. Weaver et al. discloses electrically insulating solder masks such as a photosensitive epoxy, a photosensitive polyimide and multi-layer reflector sheets. Weaver et al. discloses for sufficiently high concentrations of filler material, the reflectance of the solder mask can be increased. As the amount of filler increases, the more brittle a film tends to become, making the film more difficult to handle during the manufacturing process. Conventional reflective solder masks can be problematic for any one of a number of reasons, such as: i. insufficient whiteness, ii. insufficient reflectance, iii. poor reflectance and poor color stability upon thermal exposure over time (i.e. poor thermal aging), iv. poor mechanical properties, v. poor color stability upon UV exposure (i.e. poor UV aging), and vi. deformation or discoloration during soldering. A need therefore exists for improved reflective solder masks.

In one embodiment, the solder mask of the present disclosure has a reflectivity of at least 80 percent. In another embodiment, the solder mask has a reflectivity of at least 85 percent. The reflectivity is measured according to ASTM E1164. The reflectivity is achieved with out the need for additional reflective surfaces on the solder mask. Thus, additional reflective surfaces are generally not necessary to enhance and direct light. Without the need for an additional reflective surface, the solder mask of the present disclosure simplifies structure and production. Also a solder mask having more than one layer is prone to delamination and or curling. The solder mask has an L-color of at least 85. In some embodiments, the solder mask has an L-color of at least 90. The L-color as defined by CIE 1976 (L*, a*, b*) color space. An L-color of 100 is considered to be true white.

Yet another advantage of the solder mask of the present disclosure is reflectivity and color are maintained during thermal aging. Another advantage is the solder mask of the present disclosure does not discolor during soldering. White PET typically has comparable reflectivity to the filled polyimide layer of the present disclosure. Generally, white PET deforms under solder conditions during the imaging process and therefore could not be used as a solder mask. The solder mask of the present disclosure exhibits: i. sufficient whiteness, ii. sufficient reflectance, iii. sufficient thermal aging, iv. sufficient mechanical properties, and v. does not deform or discolor during soldering.

The solder mask may optionally include reinforcing fillers, additives and the like so long as they do not negatively impact the advantages of the solder mask of the present disclosure. In some embodiments, examples of additives that would negatively impact the advantages of the solder mask of the present disclosure are, but not limited to, black pigments or matting agents. In some embodiments, small amounts of blue pigment may be added. In small amounts, blue pigment visually enhances and/or balances the white color. In some embodiments, blue pigments such as cobalt pigments, copper pigments, iron pigments, aluminum pigments or mixtures thereof may be used. In one embodiment, aluminum pigments are used. In some embodiments, the solder mask additionally comprises sodium aluminum sulfosilicate pigment (Ultramarine) in an amount from 0.01 to 1 weight percent of the filled polyimide layer.

The solder mask of the present disclosure exhibits: i. sufficient whiteness, ii. sufficient reflectance, iii. sufficient thermal aging, iv. sufficient mechanical properties, and v. does not deform or discolor during soldering. The combination of the solder mask of the present disclosure and the light emitting diode assembly filled polyimide layer produce a light emitting diode assembly with enhanced reflectance compared to if only one was used. When used in combination, all exposed surfaces are reflective further enhancing and redirecting light from the attached LED(s).

In some embodiments, the light emitting diode assembly comprises
  A. a filled polyimide layer having a filled polyimide layer first surface and a filled polyimide layer second surface; the filled polyimide layer comprising:
    i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
    ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions;
  B. electrically conductive circuit traces formed on at least the filled polyimide layer first surface;
  C. at least one light emitting diode attached to the filled polyimide layer first surface or attached to the electrically conductive traces; and
  D. an encapsulant covering exposed surfaces of the light emitting diode and at least a portion of the filled polyimide layer first surface.

In some embodiments, the light emitting diode assembly comprises
  A. a filled polyimide layer having a filled polyimide layer first surface and a filled polyimide layer second surface; the filled polyimide layer consisting essentially of:
    i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
    ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions;
  B. electrically conductive circuit traces formed on at least the filled polyimide layer first surface;
  C. at least one light emitting diode attached to the filled polyimide layer first surface or attached to the electrically conductive traces; and
  D. an encapsulant covering exposed surfaces of the light emitting diode and at least a portion of the filled polyimide layer first surface.

In some embodiments, the light emitting diode assembly comprises
  A. a filled polyimide layer having a filled polyimide layer first surface and a filled polyimide layer second surface; the filled polyimide layer consisting essentially of:
    i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
    ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions;
    iii). sodium aluminum sulfosilicate pigment in an amount from 0.01 to 1 weight percent of the filled polyimide layer.
  B. electrically conductive circuit traces formed on at least the filled polyimide layer first surface;
  C. at least one light emitting diode attached to the filled polyimide layer first surface or attached to the electrically conductive traces; and
  D. an encapsulant covering exposed surfaces of the light emitting diode and at least a portion of the filled polyimide layer first surface.

In another embodiment, for any of the above described light emitting diode assembly embodiments, the white pigment is titanium dioxide. In another embodiment, for any of the above described light emitting diode assembly embodiments, the polyimide is derived from at least 50 mole percent of 3,3',4,4'-biphenyltetracarboxylic dianhydride, based on a total dianhydride content of the polyimide. In another embodiment, for any of the above described light emitting diode assembly embodiments the polyimide is derived from 90 mole percent of 3,3',4,4'-biphenyltetracarboxylic dianhydride, and 100 mole percent of 2,2'-bis(trifluoromethyl)benzidine. In another embodiment, for any of the above described light emitting diode assembly embodiments the polyimide is derived from 100 mole percent of 3,3',4,4'-biphenyltetracarboxylic dianhydride, and 100 mole percent of 2,2'-bis(trifluoromethyl)benzidine.

In another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of 4,4'-(hexafluoroisopropylidene) diphthalic anhydride (6FDA) based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of pyromellitic dianhydride based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of 4,4'-oxydiphthalic anhydride (ODPA); 4,4'-(4,4'-isopropylidenediphenoxy)bis(phthalic anhydride) (BPADA); 2,3,3',4'-biphenyl tetracarboxylic dianhydride; 2,2',3,3'-biphenyl tetracarboxylic dianhydride or mixtures thereof based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of diphenylsulfonetetracarboxylic dianhydride (DSDA); 4,4'-bisphenol A dianhydride; 1,2,3,4-cyclobutanetetracarboxylic acid dianhydride; (−)-[1S*,5R*,6S*]-3-oxabicyclo[3.2.1]octane-2,4-dione-6-spiro-3-(tetrahydrofuran-2,5-dione); bicyclo[2.2.2]oct-7-ene-2,3,5,6-tetracarboxylicdianhydride, 9,9-disubstituted xanthenes or mixtures thereof based on the total dianhydride content of the polyimide.

In some embodiments, the light emitting diode assembly comprises
A. a filled polyimide layer having a filled polyimide layer first surface and a filled polyimide layer second surface; the filled polyimide layer comprising:
  i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
  ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions.
B. electrically conductive circuit traces formed on at least the filled polyimide layer first surface;
C. at least one light emitting diode attached to the filled polyimide layer first surface or attached to the electrically conductive traces; and
D. an encapsulant covering exposed surfaces of the light emitting diode and at least a portion of the filled polyimide layer first surface; and
E. a solder mask, the solder mask comprising:
  i). a polyimide in an amount from 50 to 75 weight percent of the solder mask, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
  ii). a white pigment in an amount from 20 to 50 weight percent of the solder mask and wherein the white pigment
    a. is less than 800 nanometers in at least one dimension,
    b. has an average aspect ratio greater than 3:1,
    c. is less than the solder mask thickness in all dimensions;

In some embodiments, the light emitting diode assembly comprises
A. a filled polyimide layer having a filled polyimide layer first surface and a filled polyimide layer second surface; the filled polyimide layer consisting essentially of:
  i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
  ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions.
B. electrically conductive circuit traces formed on at least the filled polyimide layer first surface;
C. at least one light emitting diode attached to the filled polyimide layer first surface or attached to the electrically conductive traces; and
D. an encapsulant covering exposed surfaces of the light emitting diode and at least a portion of the filled polyimide layer first surface; and
E. a solder mask, the solder mask consisting essentially of:
  i). a polyimide in an amount from 50 to 75 weight percent of the solder mask, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl) benzidine based on a total diamine content of the polyimide;
  ii). a white pigment in an amount from 20 to 50 weight percent of the solder mask and wherein the white pigment
    a. is less than 800 nanometers in at least one dimension,
    b. has an average aspect ratio greater than 3:1, c. is less than the solder mask thickness in all dimensions.

In another embodiment, the light emitting diode assembly comprises:

A. a filled polyimide layer having a filled polyimide layer first surface and a filled polyimide layer second surface; the filled polyimide layer comprising:
  i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl)benzidine based on a total diamine content of the polyimide;
  ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions.
  iii). sodium aluminum sulfosilicate pigment in an amount from 0.01 to 1 weight percent of the filled polyimide layer.
B. electrically conductive circuit traces formed on at least the filled polyimide layer first surface;
C. at least one light emitting diode attached to the filled polyimide layer first surface or attached to the electrically conductive traces; and
D. an encapsulant covering exposed surfaces of the light emitting diode and at least a portion of the filled polyimide layer first surface; and
E. a solder mask, the solder mask comprising:
  i). a polyimide in an amount from 50 to 75 weight percent of the solder mask, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl) benzidine based on a total diamine content of the polyimide;
  ii). a white pigment in an amount from 20 to 50 weight percent of the solder mask and wherein the white pigment
    a. is less than 800 nanometers in at least one dimension,
    b. has an average aspect ratio greater than 3:1,
    c. is less than the solder mask layer thickness in all dimensions; and
  iii). sodium aluminum sulfosilicate pigment in an amount from 0.01 to 1 weight percent of the solder mask.

In another embodiment, the light emitting diode assembly comprises

A. a filled polyimide layer having a filled polyimide layer first surface and a filled polyimide layer second surface; the filled polyimide layer consisting essentially of:
  i). a polyimide in an amount from 50 to 75 weight percent of the filled polyimide layer, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl) benzidine based on a total diamine content of the polyimide;
  ii). a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions.
  iii). sodium aluminum sulfosilicate pigment in an amount from 0.01 to 1 weight percent of the filled polyimide layer.
B. electrically conductive circuit traces formed on at least the filled polyimide layer first surface;
C. at least one light emitting diode attached to the filled polyimide layer first surface or attached to the electrically conductive traces; and
D. an encapsulant covering exposed surfaces of the light emitting diode and at least a portion of the filled polyimide layer first surface; and
E. a solder mask, the solder mask consisting essentially of:
  i). a polyimide in an amount from 50 to 75 weight percent of the solder mask, the polyimide being derived from:
    a. at least 45 mole percent of 3,3',4,4'-biphenyltetracarboxylic dianhydride, based on a total dianhydride content of the polyimide, and
    b. at least 50 mole percent of 2,2'-bis(trifluoromethyl) benzidine based on a total diamine content of the polyimide;
  ii). a white pigment in an amount from 20 to 50 weight percent of the solder mask and wherein the white pigment
    a. is less than 800 nanometers in at least one dimension,
    b. has an average aspect ratio greater than 3:1,
    c. is less than the solder mask thickness in all dimensions, and
  iii). sodium aluminum sulfosilicate pigment in an amount from 0.01 to 1 weight percent of the solder mask.

In some embodiments, for any of the above described light emitting diode assembly embodiments, the white pigment of the filled polyimide layer and the white pigment of the solder mask are independently titanium dioxide or both are titanium dioxide.

In another embodiment, for any of the above described light emitting diode assembly embodiments, the polyimide of the filled polyimide layer and the polyimide of the solder mask are independantly derived from (or both are derived from) at least 50 mole percent of 3,3',4,4'-biphenyltetracarboxylic dianhydride, based on a total dianhydride content of the polyimide. In another embodiment, for any of the above described light emitting diode assembly embodiments the polyimide of the filled polyimide layer and the polyimide of the solder mask are independently derived from (or both are derived from) 90 mole percent of 3,3',4,4'-biphenyltetracarboxylic dianhydride, and 100 mole percent of 2,2'-bis(trifluoromethyl)benzidine. In another embodiment, for any of the above described light emitting diode assembly embodiments the polyimide of the filled polyimide layer and the polyimide of the solder mask are independantly derived from (or both are derived from) 100 mole percent of 3,3',4,4'-biphenyltetracarboxylic dianhydride, and 100 mole percent of 2,2'-bis (trifluoromethyl)benzidine.

In another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of 4,4'-(hexafluoroisopropylidene) diphthalic anhydride (6FDA) based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of pyromellitic dianhydride based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of 4,4'-oxydiphthalic anhydride (ODPA); 4,4'-(4,4'-isopropylidenediphenoxy)bis(phthalic anhydride) (BPADA); 2,3,3',4'-biphenyl tetracarboxylic dianhydride; 2,2',3,3'-biphenyl tetracarboxylic dianhydride or mixtures thereof based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of diphenylsulfonetetracarboxylic dianhydride (DSDA); 4,4'-bisphenol A dianhydride; 1,2,3,4-cyclobutanetetracarboxylic acid dianhydride; (−)-[1S*,5R*,6S*]-3-oxabicyclo[3.2.1]octane-2,4-dione-6-spiro-3-(tetrahydrofuran-2,5-dione); bicyclo[2.2.2]oct-7-ene-2,3,5,6-tetracarboxylicdianhydride, 9,9-disubstituted xanthenes or mixtures thereof based on the total dianhydride content of the polyimide.

Thermal Control Blanket

Visible light is the main source of thermal energy in the space environment. Thermal control coatings (thermal control blankets) are used over sensitive space craft or satellite components to prevent excessive heat build-up. Broadly speaking, reflective materials for thermal control blankets are known; see for example, U.S. Pat. No. 7,270,891 to Roth, et al and WO02/097829 to Long et al.

Conventional thermal control blankets can be problematic for any one of a number of reasons, such as insufficient reflectance, poor adhesion, complex structures, expensive metals or polymers, polymers with low Tg and/or high CTE which is undesirable for use in possible extreme thermal environments of space when exposed to direct sunlight. While white polyethylene terephthalate has good reflectance, polyethylene terephthalate is not able to withstand long term exposure in low Earth orbit space environment; see "Changes in Optical and Thermal Properties of the MISSE 2 PEACE Polymers and Spacecraft Silicones", Waters et al.; 11$^{th}$ International Symposium on Materials in Space Environment, Sep. 15-18 2009, Aix en Provence, France. Multilayer coatings or laminates can be problematic due to poor adhesion between layers, increased cost due to more complex manufacturing and additional material cost. It is also desirable to reduce the unit weight of the thermal control blanket. A need therefore exists for lower cost, improved thermal control blanket.

One embodiment of the present disclosure is a thermal control blanket comprising a filled polyimide layer. The filled polyimide layer consisting essentially of a polyimide, a white pigment and an electrically conductive filler. The polyimide is present in an amount between and including and two of the following: 50, 55, 60, 65, 70 and 75 weight percent of the filled polyimide layer. In some embodiments, the polyimide is present in an amount from 50 to 75 weight percent of the filled polyimide layer. The white pigment is present in an amount between and including any two of the following: 20, 25, 30, 35, 40, 45 and 50 weight percent of the filled polyimide layer. In some embodiments, the white pigment is present in an amount from 20 to 50 weight percent of the filled polyimide layer. In some embodiments, the white pigment is titanium dioxide.

In some embodiments, the electrically conductive filler is present in an amount between and including any two of the following: 2, 3, 4 and 5 weight percent of the filled polyimide layer. In some embodiments, the electrically conductive filler is present in an amount from 2 to 5 weight percent of the filled polyimide layer. In some embodiments, the electrically conductive filler is selected from the group consisting of carbon, carbon black, graphite, metal particles and mixtures thereof. The electrically conductive filler renders the filled polyimide layer sufficiently electrically conductive to enable the discharge of electrostatic charge, thus preventing damaging rapid discharge.

Another embodiment of the present disclosure is a thermal control blanket comprising a filled polyimide layer. The filled polyimide layer consisting essentially of:

A. a polyimide in an amount from 50 to 75 weight percent of the filled polyimide layer, the polyimide being derived from:
  a) at least 45 mole percent of 3,3',4,4'-biphenyltetracarboxylic dianhydride, based on a total dianhydride content of the polyimide,
  b) at least 50 mole percent of 2,2'-bis(trifluoromethyl)benzidine based on a total diamine content of the polyimide; and B. a white pigment in an amount from 20 to 50 weight percent of the filled polyimide layer and wherein the white pigment
  a. is less than 800 nanometers in at least one dimension,
  b. has an average aspect ratio greater than 3:1,
  c. is less than the filled polyimide layer thickness in all dimensions.

C. an electrically conductive filler in an amount up to 5 weight percent of the filled polyimide layer. The thermal control blanket has a L-color of at least 85 determined by ASTM E308 [10° observer and illuminant D65] and a reflectivity of at least 80 percent measured according to ASTM E1164.

In some embodiments, the polyimide is derived from:
  a) at least 50 mole percent of 3,3',4,4'-biphenyltetracarboxylic dianhydride, based on a total dianhydride content of the polyimide,
  b) at least 50 mole percent of 2,2'-bis(trifluoromethyl)benzidine based on a total diamine content of the polyimide. In some embodiments, the white pigment is titanium dioxide.

In one embodiment, the thermal control blanket polyimide is derived from 90 mole percent of 3,3',4,4'-biphenyltetracarboxylic dianhydride, and 100 mole percent of 2,2'-bis(trifluoromethyl)benzidine and the white pigment is titanium dioxide. In another embodiment, the thermal control blanket polyimide is derived from 100 mole percent of 3,3',4,4'-biphenyltetracarboxylic dianhydride, and 100 mole percent of 2,2'-bis(trifluoromethyl)benzidine and the white pigment is titanium dioxide. In another embodiment, the thermal control blanket polyimide is additionally derived from not more than 55 weight percent of 4,4'-oxydiphthalic anhydride (ODPA); 4,4'-(4,4'-isopropylidenediphenoxy)bis(phthalic anhydride) (BPADA); 2,3,3',4'-biphenyl tetracarboxylic dianhydride; 2,2',3,3'-biphenyl tetracarboxylic dianhydride or mixtures thereof based on the total dianhydride content of the polyimide. In yet another embodiment, the thermal control blanket polyimide is additionally derived from not more than 55 weight percent of diphenylsulfonetetracarboxylic dianhydride (DSDA); 4,4'-bisphenol A dianhydride; 1,2,3,4-cyclobutanetetracarboxylic acid dianhydride; (−)-[1S*,5R*, 6S*]-3-oxabicyclo[3.2.1]octane-2,4-dione-6-spiro-3-(tetrahydrofuran-2,5-dione) [and bicyclo[2.2.2]oct-7-ene-2, 3,5,6-tetracarboxylicdianhydride, 9,9-disubstituted xanthenes and mixtures thereof based on the total dianhydride content of the polyimide. In yet another embodiment, the thermal control blanket polyimide is additionally derived from not more than 55 weight percent of 4,4'-(hexafluoroisopropylidene) diphthalic anhydride (6FDA) based on the total dianhydride content of the polyimide. In another embodiment, the thermal control blanket polyimide is additionally derived from not more than 55 weight percent of pyromellitic dianhydride based on the total dianhydride content of the polyimide. In yet another embodiment, the thermal control blanket polyimide is additionally derived from no more than 50 mole percent of trans-1,4-diaminocyclohexane; 3,5-diaminobenzotrifluoride; 2-(trifluoromethyl)-1,4-phenylenediamine; 1,3-diamino-2,4,5,6-tetrafluorobenzene; 2,2-bis(3-aminophenyl) 1,1,1,3,3,3-hexafluoropropane; 2,2'-bis-(4-aminophenyl)-hexafluoropropane (6F diamine); 3,4'-oxydianiline (3,4'-ODA), m-phenylene diamine (MPD), 4,4-bis(trifluoromethoxy)benzidine, 3,3'-diamino-5,5'-trifluoromethyl biphenyl, 3,3'-diamino-6,6'-trifluoromethyl biphenyl, 3,3'-bis(trifluoromethyl)benzidine; 2,2-Bis[4-(4-aminophenoxy)phenyl]hexafluoropropane (4-BDAF), 4,4'-diaminodiphenyl sulfide (4,4'-DDS); 3,3'-diaminodiphenyl sulfone (3,3'-DDS); 4,4'-diaminodiphenyl sulfone; 2,2'-bis(dimethyl)benzidine; 3,3'-bis(dimethyl)benzidine; 4,4'-trifluoromethyl-2,2'-diaminobiphenyl and derivatives thereof based on the total diamine content of the polyimide.

The thermal control blanket, in accordance with the present disclosure, has high reflectivity. Thus, additional reflective layers, such as silicon or geranium are not necessary to achieve high reflectance. The thermal control blanket of the present disclosure simplifies structure, production and can provide a reduction in weight.

The thermal control blanket has mechanical properties typically superior to films made with semi-aromatic polymers. Aromatic polymers typically exhibit better UV stability, and better mechanical properties such as modulus or elongation. The higher the modulus (strength), the thinner the film can be made. Thinner films enable production of smaller components and lower cost. A higher modulus and higher elongation enable a film to be used in dynamic flexural applications. Aromatic polymers typically can withstand higher temperatures without degradation. The exposure to elevated temperatures may be continuous or cumulative (a few hours at a time and over several uses).

In some embodiments, the thermal control blanket has a modulus of at least 500 kpsi (35162 kg/cm$^2$). In some embodiments, the thermal control blanket has a modulus of at least 900 kpsi (63291 kg/cm$^2$). Modulus is determined by ASTM D-882.

Another advantage is that the polyimide has low color prior to the addition of pigment. Thus, the addition of white pigment produces a thermal control blanket with:

i) L-color of at least 85. In some embodiments, the thermal control blanket has an L-color of at least 90. The L-color as defined by CIE 1976 (L*, a*, b*) color space determined by ASTM E308 [10° observer and illuminant D65]. An L-color of 100 is considered to be true white.

ii) reflectivity of at least 80 percent. In some embodiments, the thermal control blanket has reflectivity of at least 85 percent. The reflectivity is measured according to ASTM E1164. In addition, less white pigment is required to obtain the L-color and reflectivity thus maintaining good mechanical properties.

Other advantages of the thermal control blanket of the present disclosure are reflectivity and color is maintained during thermal aging and ability to resist long term low earth orbit exposure.

It is desirable for a thermal control blanket to have solar reflection greater than 60 percent, solar absorptivity less than 20 percent and solar transmissivity less than 30 percent all measured according to ASTM E1105 (air mass-0, near normal incidence (=<) 15°), average of two orientations on the plane. Additionally, it is desirable for a thermal control blanket to have infrared reflectivity of less than 20 percent, infrared emissivity of greater than 80 percent and a infrared transmissivity of less than 5 percent all measured according to ASTM E408, (300K black-body weighting, near normal incidence (=<) 15°), average of two orientations on the plane. The thermal control blanket of the present disclosure has a solar reflection of 65 percent, solar absorptivity of 15 percent and solar transmissivity of 20 percent all measured according to ASTM E1105 (air mass-0, near normal incidence (=<) 15°), average of two orientations on the plane. Additionally, the thermal control blanket of the present disclosure has a infrared reflectivity of 17 percent, infrared emissivity of 83 percent and a infrared transmissivity of zero percent all measured according to ASTM E408, (300K black-body weighting, near normal incidence (=<) 15°), average of two orientations on the plane. Thus, the thermal control blanket of the present disclosure performs at least as well as or better than traditional thermal control blankets.

The filled polyimide layer of the thermal control blanket may optionally include reinforcing fillers or other additives so long as they do not negatively impact the advantages of the thermal control blanket of the present disclosure. In some embodiments, examples of additives that would negatively impact the advantages of the thermal control blanket of the present disclosure are, but not limited to, black pigments in an amount above 5 weight percent or matting agents. In some embodiments, the amount of electrically conductive filler can be tailored to provide potential for electrostatic discharge while exhibiting little change in reflectivity. In some embodiments, small amounts of blue pigment may be added. In small amounts, blue pigment visually enhances and/or balances the white color. In some embodiments, blue pigments such as cobalt pigments, copper pigments, iron pigments, aluminum pigments or mixtures thereof may be used. In one embodiment, aluminum pigments are used. In some embodiments, the filled polyimide layer additionally consisting essentially of sodium aluminum sulfosilicate pigment (Ultramarine) in an amount between and optionally including any two of the following; 0.01, 0.05, 0.1, 0.2, 0.3, 0.4, 0.5, 0.6, 0.7, 0.8, 0.9 and 1 weight percent of the filled polyimide layer. In some embodiments, the filled polyimide layer additionally consisting essentially of sodium aluminum sulfosilicate pigment (Ultramarine) in an amount from 0.01 to 1 weight percent of the filled polyimide layer.

In some embodiments, the thermal control blanket is attached to a substrate. In some embodiments, the substrate is a metal. In another embodiment, the substrate is a polymer. In some embodiments, the thermal control blanket may be directly adhered to the substrate by lamination or coextrusion. In some embodiments, an adhesive is used to adhere the thermal blanket to the substrate. In some embodiments, the adhesive layer is an epoxy resin. In one embodiment, the adhesive layer consists of an epoxy resin and hardener, and, optionally, further contains additional components, depending on desired properties, such as, an elastomer reinforcing agent, curing accelerator, filler and flame retardant. In some embodiments, the epoxy resin is selected from the group consisting of bisphenol A type epoxy resin, bisphenol F type epoxy resin, bisphenol S type epoxy resin, phenol novolac type epoxy resin, cresol novolac type epoxy resin, biphenyl type epoxy resin, biphenyl aralkyl type epoxy resin, aralkyl type epoxy resin, dicyclopetadiene type epoxy resin, multi-functional type epoxy resin, naphthalene type epoxy resin, phosphorus containing epoxy resin, rubber modified epoxy resin, and mixtures thereof.

In another embodiment, the adhesive layer is an acrylic adhesive or methacrylic adhesives ("acrylic" and/or "methacrylic" will be referred to herein as "(meth)acrylic"). In some embodiments, the adhesive layer is a pressure sensitive (meth)acrylic adhesive. (Meth)acrylic pressure sensitive adhesives are generally prepared by copolymerizing a suitable (meth)acrylic acid with alkyl esters and can include suitable tackifiers, plasticizers and other additives to adjust properties, as desired. Pressure sensitive (meth)acrylic adhesives are well known and need not be described in detail here.

In another embodiment, a (metal oxide) adhesion promoter can be applied to the thermal control blanket to enhance the adhesion of the thermal control blanket to a substrate. The adhesive or adhesion promoter can be applied to one or both sides of the thermal control blanket by vacuum deposition, atomic layer deposition or plasma deposition. In some embodiments, the thermal control blanket additionally comprises an adhesive layer on at least one side of the thermal control blanket. In another embodiment, the thermal control blanket additionally comprises an adhesion promoter layer on at least one side of the thermal control blanket. In some embodiments, the thermal control blanket additionally comprises an adhesive on at least one side of the thermal control blanket, wherein the adhesive is an epoxy adhesive, acrylic adhesive or methacrylic adhesive. In some embodiments, the thermal control blanket additionally comprises a metal oxide adhesion promoter layer on at least one side of the thermal control blanket.

In some embodiments, the thermal control blanket comprises a filled polyimide layer; the filled polyimide layer comprising:

A. a polyimide in an amount from 50 to 75 weight percent of the filled polyimide layer, the polyimide being derived from:
  a) at least 45 mole percent of 3,3',4,4'-biphenyltetracarboxylic dianhydride, based on a total dianhydride content of the polyimide,
  b) at least 50 mole percent of 2,2'-bis(trifluoromethyl) benzidine based on a total diamine content of the polyimide; and B. a white pigment in an amount from 20 to 50 weight percent of the filled polyimide layer and wherein the white pigment
  a. is less than 800 nanometers in at least one dimension,
  b. has an average aspect ratio greater than 3:1,
  c. is less than the filled polyimide layer thickness in all dimensions;

C. an electrically conductive filler is present in an amount from 2 to 5 weight percent of the filled polyimide layer; wherein the thermal control blanket has a L-color of at least 85 determined by ASTM E308 [10° observer and illuminant D65] and a reflectivity of at least 80 percent measured according to ASTM E1164.

In some embodiments, the thermal control blanket comprises a filled polyimide layer; the filled polyimide layer consisting essentially of:

A. a polyimide in an amount from 50 to 75 weight percent of the filled polyimide layer, the polyimide being derived from:
  a) at least 45 mole percent of 3,3',4,4'-biphenyltetracarboxylic dianhydride, based on a total dianhydride content of the polyimide,
  b) at least 50 mole percent of 2,2'-bis(trifluoromethyl) benzidine based on a total diamine content of the polyimide; and B. a white pigment in an amount from 20 to 50 weight percent of the filled polyimide layer and wherein the white pigment
  a. is less than 800 nanometers in at least one dimension,
  b. has an average aspect ratio greater than 3:1,
  c. is less than the filled polyimide layer thickness in all dimensions;

C. an electrically conductive filler is present in an amount from 2 to 5 weight percent of the filled polyimide layer;

D. a sodium aluminum sulfosilicate pigment in an amount from 0.01 to 1 weight percent of the filled polyimide layer; wherein the thermal control blanket has a L-color of at least 85 determined by ASTM E308 [10° observer and illuminant D65] and a reflectivity of at least 80 percent measured according to ASTM E1164.

In some embodiments, the thermal control blanket comprises a filled polyimide layer; the filled polyimide layer consisting essentially of:

A. a polyimide in an amount from 50 to 75 weight percent of the filled polyimide layer, the polyimide being derived from:
  a) at least 45 mole percent of 3,3',4,4'-biphenyltetracarboxylic dianhydride, based on a total dianhydride content of the polyimide,
  b) at least 50 mole percent of 2,2'-bis(trifluoromethyl) benzidine based on a total diamine content of the polyimide; and B. a white pigment in an amount from 20 to 50 weight percent of the filled polyimide layer and wherein the white pigment
  a. is less than 800 nanometers in at least one dimension,
  b. has an average aspect ratio greater than 3:1,
  c. is less than the filled polyimide layer thickness in all dimensions;

C. an electrically conductive filler is present in an amount from 2 to 5 weight percent of the filled polyimide layer and selected from the group consisting of carbon, carbon black, graphite, metal particles and mixtures thereof; wherein the thermal control blanket has a L-color of at least 85 determined by ASTM E308 [10° observer and illuminant D65] and a reflectivity of at least 80 percent measured according to ASTM E1164.

In some embodiments, the thermal control blanket comprises a filled polyimide layer; the filled polyimide layer comprising:
  A. a polyimide in an amount from 50 to 75 weight percent of the filled polyimide layer, the polyimide being derived from:
    a) at least 45 mole percent of 3,3',4,4'-biphenyltetracarboxylic dianhydride, based on a total dianhydride content of the polyimide,
    b) at least 50 mole percent of 2,2'-bis(trifluoromethyl)benzidine based on a total diamine content of the polyimide; and
  B. a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions;
  C. an electrically conductive filler is present in an amount from 2 to 5 weight percent of the filled polyimide layer and is selected from the group consisting of carbon, carbon black, graphite, metal particles and mixtures thereof; wherein the thermal control blanket has a L-color of at least 85 determined by ASTM E308 [10° observer and illuminant D65] and a reflectivity of at least 80 percent measured according to ASTM E1164 and the thermal control blanket additionally comprising i). an adhesive on at least one side of the thermal control blanket, wherein the adhesive is an epoxy adhesive, acrylic adhesive or methacrylic adhesive or ii). a metal oxide adhesion promoter layer on at least one side of the thermal control blanket.

In some embodiments, the thermal control blanket comprises a filled polyimide layer; the filled polyimide layer consisting essentially of:
  A. a polyimide in an amount from 50 to 75 weight percent of the filled polyimide layer, the polyimide being derived from:
    a) at least 45 mole percent of 3,3',4,4'-biphenyltetracarboxylic dianhydride, based on a total dianhydride content of the polyimide,
    b) at least 50 mole percent of 2,2'-bis(trifluoromethyl)benzidine based on a total diamine content of the polyimide; and
  B. a white pigment in an amount from 20 to 50 weight percent of the filled polyimide layer and wherein the white pigment
    a. is less than 800 nanometers in at least one dimension,
    b. has an average aspect ratio greater than 3:1,
    c. is less than the filled polyimide layer thickness in all dimensions;
  C. an electrically conductive filler is present in an amount from 2 to 5 weight percent of the filled polyimide layer and is selected from the group consisting of carbon, carbon black, graphite, metal particles and mixtures thereof; wherein the thermal control blanket has a L-color of at least 85 determined by ASTM E308 [10° observer and illuminant D65] and a reflectivity of at least 80 percent measured according to ASTM E1164 and the thermal control blanket additionally comprising i). an adhesive on at least one side of the thermal control blanket, wherein the adhesive is an epoxy adhesive, acrylic adhesive or methacrylic adhesive or ii). a metal oxide adhesion promoter layer on at least one side of the thermal control blanket.

In some embodiments, for any of the above described thermal control blanket embodiments, the white pigment is titanium dioxide.

In another embodiment, for any of the above described thermal control blanket embodiments, the polyimide is derived from at least 50 mole percent of 3,3',4,4'-biphenyltetracarboxylic dianhydride, based on a total dianhydride content of the polyimide. In another embodiment, for any of the above described thermal control blanket embodiments the polyimide is derived from 90 mole percent of 3,3',4,4'-biphenyltetracarboxylic dianhydride, and 100 mole percent of 2,2'-bis(trifluoromethyl)benzidine. In another embodiment, for any of the above described thermal control blanket embodiments the polyimide is derived from 100 mole percent of 3,3',4,4'-biphenyltetracarboxylic dianhydride, and 100 mole percent of 2,2'-bis(trifluoromethyl)benzidine.

In another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of 4,4'-(hexafluoroisopropylidene) diphthalic anhydride (6FDA) based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of pyromellitic dianhydride based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of 4,4'-oxydiphthalic anhydride (ODPA); 4,4'-(4,4'-isopropylidenediphenoxy)bis(phthalic anhydride) (BPADA); 2,3,3',4'-biphenyl tetracarboxylic dianhydride; 2,2',3,3'-biphenyl tetracarboxylic dianhydride or mixtures thereof based on the total dianhydride content of the polyimide.

In yet another embodiment, when the polyimide is derived from at least 45 mole percent of 3,3',4,4'-biphenyltetracarboxylic dianhydride, based on a total dianhydride content of the polyimide, the polyimide is additionally derived from not more than 55 weight percent of diphenylsulfonetetracarboxylic dianhydride (DSDA); 4,4'-bisphenol A dianhydride; 1,2,3,4-cyclobutanetetracarboxylic acid dianhydride; (−)-[1S*,5R*,6S*]-3-oxabicyclo[3.2.1]octane-2,4-dione-6-spiro-3'-(tetrahydrofuran-2,5-dione); bicyclo[2.2.2]oct-7-ene-2,3,5,6-tetracarboxylicdianhydride, 9,9-disubstituted xanthenes or mixtures thereof based on the total dianhydride content of the polyimide.

All publications, patent applications, patents, and other references mentioned herein are incorporated by reference in their entirety. Unless otherwise defined, all technical and scientific terms used herein have the same meaning as commonly understood by one of ordinary skill in the art to which this invention belongs. In case of conflict, the present specification, including definitions, will control.

Although methods and materials similar or equivalent to those described herein can be used in the practice or testing of the present invention, suitable methods and materials are described herein.

Note that not all of the activities described above in the general description are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. All features disclosed in this specification may be replaced by alternative features serving the same, equivalent or similar purpose. Accordingly, the specification is to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

When an amount, concentration, or other value or parameter is given as either a range, preferred range or a list of upper values and lower values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

What is claimed is:

1. A light emitting diode assembly comprising:
   A. a filled polyimide layer having a filled polyimide layer first surface and a filled polyimide layer second surface; the filled polyimide layer consisting essentially of:
      i). a polyimide in an amount from 50 to 75 weight percent of the filled polyimide layer, the polyimide being derived from:
         a. at least 45 mole percent of 3,3',4,4'-biphenyltetracarboxylic dianhydride, based on a total dianhydride content of the polyimide, and
         b. at least 50 mole percent of 2,2'-bis(trifluoromethyl) benzidine based on a total diamine content of the polyimide;
      ii). a white pigment in an amount from 20 to 50 weight percent of the filled polyimide layer and wherein the white pigment
         a. is less than 800 nanometers in at least one dimension,
         b. has an average aspect ratio greater than 3:1,
         c. is less than the filled polyimide layer thickness in all dimensions;
   B. electrically conductive circuit traces formed on at least the filled polyimide layer first surface;
   C. at least one light emitting diode attached to the filled polyimide layer first surface or attached to the electrically conductive traces; and
   D. an encapsulant covering exposed surfaces of the light emitting diode and at least a portion of the filled polyimide layer first surface.

2. The light emitting diode assembly of claim 1 wherein the filled polyimide layer additionally consisting essentially of sodium aluminum sulfosilicate pigment in an amount from 0.01 to 1 weight percent of the filled polyimide layer.

3. The light emitting diode assembly of claim 1 wherein the white pigment is titanium dioxide.

4. The light emitting diode assembly of claim 1 wherein the polyimide is derived from 90 mole percent of 3,3',4,4'-biphenyltetracarboxylic dianhydride, and 100 mole percent of 2,2'-bis(trifluoromethyl) benzidine and the white pigment is titanium dioxide.

5. The light emitting diode assembly of claim 1 wherein the polyimide is derived from 100 mole percent of 3,3',4,4'-biphenyltetracarboxylic dianhydride, and 100 mole percent of 2,2'-bis(trifluoromethyl) benzidine and the white pigment is titanium dioxide.

6. The light emitting diode assembly of claim 1 wherein the polyimide is derived from at least 50 mole percent of 3,3',4,4'-biphenyltetracarboxylic dianhydride, based on a total dianhydride content of the polyimide.

7. The light emitting diode assembly of claim 1 wherein the polyimide is additionally derived from not more than 55 weight percent of 4,4'-oxydiphthalic anhydride (ODPA); 4,4'-(4,4'-isopropylidenediphenoxy)bis(phthalic anhydride) (BPADA); 2,3,3',4'-biphenyl tetracarboxylic dianhydride; 2,2',3,3'-biphenyl tetracarboxylic dianhydride or mixtures thereof based on the total dianhydride content of the polyimide.

8. The light emitting diode assembly of claim 1 wherein the polyimide is additionally derived from not more than 55 weight percent of diphenylsulfonetetracarboxylic dianhydride (DSDA); 4,4'-bisphenol A dianhydride; 1,2,3,4-cyclobutanetetracarboxylic acid dianhydride; (−)-[1S*,5R*,6S*]-3-oxabicyclo[3.2.1]octane-2,4-dione-6-spiro-3-(tetrahydrofuran-2,5-dione); bicyclo[2.2.2]oct-7-ene-2,3,5,6-tetracarboxylicdian hydride, 9,9-disubstituted xanthenes or mixtures thereof based on the total dianhydride content of the polyimide.

9. The light emitting diode assembly of claim 1 wherein the polyimide is additionally derived from not more than 55 weight percent of 4,4'-(hexafluoroisopropylidene) diphthalic anhydride (6FDA) based on the total dianhydride content of the polyimide.

10. The light emitting diode assembly of claim 1 wherein the polyimide is additionally derived from not more than 55 weight percent of pyromellitic dianhydride based on the total dianhydride content of the polyimide.

11. The light emitting diode assembly of claim 1 wherein the encapsulant is a silicone or epoxy resin.

12. The light emitting diode assembly of claim 1 additionally comprising a solder mask, the solder mask consisting essentially of:
   i). a polyimide in an amount from 50 to 75 weight percent of the solder mask, the polyimide being derived from:
      a. at least 45 mole percent of 3,3',4,4'-biphenyltetracarboxylic dianhydride, based on a total dianhydride content of the polyimide, and
      b. at least 50 mole percent of 2,2'-bis(trifluoromethyl) benzidine based on a total diamine content of the polyimide; and
   ii). a white pigment in an amount from 20 to 50 weight percent of the solder mask and wherein the white pigment
      a. is less than 800 nanometers in at least one dimension,
      b. has an average aspect ratio greater than 3:1, c. is less than the solder mask thickness in all dimensions.

* * * * *